(12) United States Patent
Meng et al.

(10) Patent No.: US 6,661,032 B2
(45) Date of Patent: Dec. 9, 2003

(54) LIGHT EMITTING DIODE PACKAGE STRUCTURE HAVING AN ELECTRO-STATIC PROTECTIVE DIODE

(75) Inventors: Hsiang-Chih Meng, Taipei (TW); Li-Ching Ma, Tu Cheng (TW); Chi-Ming Lin, Chung Ho (TW)

(73) Assignee: United Epitaxy Co., Ltd., Hsinchu (TW)

( * ) Notice: Subject to any disclaimer, the term of this patent is extended or adjusted under 35 U.S.C. 154(b) by 0 days.

(21) Appl. No.: 10/179,212

(22) Filed: Jun. 26, 2002

(65) Prior Publication Data
US 2003/0122139 A1 Jul. 3, 2003

(30) Foreign Application Priority Data
Dec. 28, 2001 (TW) ..................................... 90223502 U

(51) Int. Cl.$^7$ ................................................ H01L 33/00
(52) U.S. Cl. .......................................... 257/99; 257/79
(58) Field of Search ............................ 257/79, 99, 199, 257/106, 603

(56) References Cited

U.S. PATENT DOCUMENTS 5,557,115 A * 9/1996 Shakuda ...................... 257/81
6,054,716 A * 4/2000 Sonobe et al. ............... 250/552
6,333,522 B1 * 12/2001 Inoue et al. .................. 257/99

* cited by examiner

Primary Examiner—B. William Baumeister
(74) Attorney, Agent, or Firm—Troxell Law Office PLLC

(57) ABSTRACT

A LED package structure having an electro-static protective diode, the structure is disclosed. The structure comprises: an electro-static protective diode having an n-type electrode mounted on a lampstand by a conductive paste layer, so that it forms an electrical connecting with a positive leadfame. A LED having a p-type and an n-type electrode positioned on one side and a bottom on the other side of the LED mounted by an insulating layer atop the p-type electrode of the electro-static protective diode. Next a first conductive wire connects between the p-type electrode of the LED and the positive leadframe. A second conductive wire, connects the n-type electrode of the LED with the negative leadframe. A third conductive wire connects the p-type electrode of the electro-static protection diode to the negative electrode of the leadframe. Transparent resin is finally used to form a dome-shaped package.

7 Claims, 3 Drawing Sheets

LIGHT EMITTING DIODE PACKAGE STRUCTURE HAVING AN ELECTRO-STATIC PROTECTIVE DIODE

1. FIELD OF THE INVENTION

The present invention relates to a package structure of a light emitting diode (LED), and more particularly, to a LED package structure having an electro-static protective diode.

2. DESCRIPTION OF THE PRIOR ART

Because of the advantage of small size, low power consumption and long life span, LEDs are widely used in household appliances, computer peripherals and communication products. In 1994, NICHIA company successfully invented a blue Gallium-nitride (GaN) LED so that a full-colored LED can be achieved. Moreover, the usage of the LED expands to full-colored LED displays, traffic lights and car lamps, maybe further replaces the illuminative application of white lamps in the future illumination.

However, the blue GaN or bluish Indium Gallium-nitride (InGaN) LED easily suffers deterioration by static electricity since the P/N junction thereof is very close to the surface. Human body may carry static electricity with the magnitude of 1–2 kV during the dry environment. If pins of the LED happens to be touched, even small currents will destroy the susceptible LED of which typical range of operation voltage is about 0–5 V. And the unit price of the blue LED or the bluish LED is higher than a primary LED by 10–100 folds. Therefore, it is necessary for the blue LED and bluish LED to equip with electrostatic protective devices.

In order to solve the above-mentioned problem, a Zener diode parallel connects to the LED according to the prior art, so as to protect the LED dies from being damaged by static electricity. FIG. 1 is a schematic diagram of electrical circuit connections of a LED 10 and its protective element, Zener diode 20. In the circuit, the LED 10 is forward bias and the Zener diode 20 is reverse bias under normal operating voltage of 5V. Since typical Zener breakdown voltage is about 8V, the Zener diode 20 is not up to the Zener breakdown voltage during normal operation voltage resulting in an un-conductive situation without consuming electric energy. However, if high voltage such as 1–2 kV is provided to pins of light emitting elements, the LED 10 and Zener diode 20 are both conductive with large portions of currents through the Zener diode 20 due to its lower resistance. Therefore, a function of the Zener diode 20 to protect the LED 10 is achieved.

In order to form the circuit with Zener diode and LED in parallel connection as FIG. 1, several conventional techniques are available, but each one has its drawbacks. At first, please refer to FIG. 2 of a schematic diagram of the first embodiment. A bottom surface 9 (n++; n-type heavy doped region) of a Zener diode 20 is mounted on a planar surface of a lampstand 15 (or say a reflector)by conductive silver pastes 14. The lampstand 15 is a cone-shaped with a plane surface on its bottom, and under the plane thereof is a positive electrode of the leadframe 13a. The Zener diode 20 comprises a p region 25 in an n-type substrate 26 having a p-type electrode 27 and an n-type electrode 28, respectively, formed thereon. Moreover, an n-type electrode 6 and a p-type electrode 5 of a LED 10 are, respectively, connects the p-type electrode 27 and the n-type electrode 28 of the Zener diode 20 by conductive solder balls 11 and 12. The p region 25 of the Zener diode 20 electrically connects to a tip of a negative electrode of the leadframe 13b via a conductive wire 17. Finally, a transparent substance, such as resin, encapsulates the aforesaid structures to form a LED package.

For a blue LED, the n-type electrode 6 and the p-type electrode 5 are positioned on the same side of the LED so that the aforesaid connections are workable. However, as to the red, yellow, or green LED, the n-type electrode 6 and the p-type electrode 5 are positioned on different sides of the LED structure so that the aforesaid connections are not workable. However, for the brightness of the LED is concerned, the aforesaid structure is better than others of the prior art because the light-emitting side of the aforesaid LED is upward and no wire-bonding pad or electrode formed thereon.

As for package techniques, there are some problems with the aforesaid structure. The areas of LED chip are several mil square (typical value is about 13×14 mil) and the height of the solder ball is about 4 mils. Therefore, it is very difficult to align the LED 10 which has the P-type electrode 5 and the n-type electrode 6 upside-down with the n-type electrode 28 and p-type electrode 27 of the Zener diode 20. Therefore, the process efficiency and process yield are hardly improved. Please notices that larger solder balls are not suitable for the case or the risk of the short-circuit 10 between the p-type electrode 27 and n-type electrode 28 will increase. Moreover, the structure of the Zener diode 20 according to the present embodiment is more complicated than the conventional diode structure only stacked by the p and the n layers leading to the increase of the process cost. Therefore, the LED package technique of FIG. 2 needs to be improved.

The second embodiment of the prior art, is disclosed by the U.S. Pat. No. 6,054,716 issued to Sonobe. Please refer to FIG. 3, The prime difference between the second and the first embodiment is the positions of a LED 53 and a Zener diode 55. According to the second embodiment, the LED 53 and the Zener diode 55 are, respectively, mounted on the recess portion 61 and a flange 62 of the curve-surfaced lampstand provided at a tip of a positive electrode of the leadframe 61a. In the second embodiment, the Zener diode is a conventional one, stacked with a p-type layer and an n-type layer. The n-type electrode 55a of the Zener diode 55 connects the flange 62 of the lampstand via silver pastes 58. The p-type electrode 55b of the Zener diode 55 connects a negative electrode of the leadframe 52b via a conductive wire 68. The p-type electrode 65 of the LED 53 connects the positive electrode of the leadframe 52a via a conductive wire 66. An n-type electrode 63 of the LED 53 connects present a p-type electrode 55b of the Zener diode 55 by a conductive wire 67. Finally, the resin 73 is utilized to package and form a dome-shaped LED structure.

Because the wire bonding process is to the upward positions of the LED and the Zener diode, the process yield in accordance with the present embodiment is better than that of the first embodiment. However, three conductive bonding wires are needed in the present embodiment instead of one as the first embodiment so that less brightness of the present structure is anticipated. Moreover, the present embodiment described may have drawbacks as following: (1) The flange 62 and the recess portion 61 of the curve-surfaced lampstand, with different altitudes, but both need to be paste with the Silver paste and thus the prices of the producing facilities for that would be high. In addition, the area of the recess portion 61 of lampstand is small enough, not much to say the area of the flange 62 and thus bring about to highlight the difficulty of pasting the silver paste thereon. (2) if the LED such as a blue GaN LED or an InGaN LED has thinner substrate may increase the overflow risk resulting short circuit during silver pastes (or conductive paste) pasting process. (3) Only the LED having a p and n-type electrode positioned on one side is applicable for the present embodiment. Above all, the package technique of the second embodiment still needs to be improved.

Please refer to FIG. 4 of a schematic diagram of the third embodiment according to the prior art. The present embodiment is in accordance with the U.S. Pat. No. 6,084,252 disclosed by Isokawa. A Zener diode 105 has an n-type electrode (not shown) formed at its bottom face mounted on a side of a positive electrode of the leadframe 107a of a lampstand with silver pastes. A p-type electrode formed at a top face of the Zener diode 105 electrically connects to a lateral surface of a negative electrode of the leadframe 107b via conductive wire 104. A LED 103 mounted on a recess portion of a curve-surfaced lampstand 101 has a p-type electrode 111 and an n-type electrode 113. The p-type electrode 111 and the n-type electrode 113 respectively connect the positive electrode of the leadframe 107a and the negative electrode of the leadframe 107b of the lampstand via conductive wires 108, 109. Resin 116 is finally used to package and form a dome-shaped LED structure.

The package structure of the third embodiment can solve the problem of aligning the Zener diode 10 with the LED 20 according to the first embodiment, and can also solve the problem of silver paste welding difficulty on the flange 62 of the curve-surfaced lampstand according to the second embodiment. However, for practical welding process is concerned, to weld the silver paste on a predetermined position of to the lateral position of a negative electrode of the leadframe 107b by robot arms. It requires at least to turning lampstand or robot arm by 90° with respect to the upright lampstand. Therefore, it's unpractical technique unless the silver paste-welding machine is re-designed or re-equipped.

It is therefore the present invention provides an improved design to solve the problems of prior art, so as to heighten the process yield and process efficiency.

SUMMARY OF THE INVENTION

It is therefore a primary objective of the present invention to provide a LED package structure having an electro-static protective device together. The present structure is not only applicable for LEDs having a p and n-type electrode on one side, such as a blue light GaN or an InGaN LED, but also applicable for LEDs having a p-type and an n-type electrode on different sides, such as a yellow or red LED. Because of the upward wire-bonded, the present structure can resolve the failure problem during flip-chip alignment.

The present invention discloses a LED package structure having an electro-static protective diode to prevent the LED from electrostatic damage. The structure comprises: an electro-static protective diode having an n-type electrode mounted on a lampstand by a conductive paste layer, and thus forms an electrical connecting with a positive leadframe. A LED having a p-type and an n-type electrode positioned on one side, and a bottom on the other side mounted to the p-type electrode of the electro-static protective diode by an insulating layer. Next a first conductive wire connects between the p-type electrode of the LED and the positive leadframe. A second conductive wire, connects the n-type electrode of the LED with the negative leadframe. A third conductive wire connects the p-type electrode of the electro-static protection diode to the negative electrode of the leadframe. Transparent Resin is finally used to form a dome-shaped package.

The idea of positioning the LED on the protective diode is also applicable for a LED having a p-type electrode and an n-type electrode on different sides, which is depicted in the second preferred embodiment. In the second preferred embodiment, a conductive paste is replaced for the insulating layer depicted in first preferred embodiment. And thus the package can reduce one conductive wire; only two conductive wires are required.

The present invention will no doubt become obvious after reading the following detailed description of the preferred embodiment, which is illustrated in the various figures and drawings.

DESCRIPTION OF THE PREFERRED EMBODIMENT

As the description of prior art, several styles of LEDs package having a protective diode are disclosed. Each style has its advantage to overcome some problem, but always followed by another new problem appearance. Therefore, the present invention provides a new LED package structure to solve the above-mentioned problems of conventional LED packages.

The present invention provides two embodiments of the package structures. The first preferred embodiment is designed for a LED package structure is composed of an electro-static protective diode and a LED having a p-type and an n-type electrode thereof on one side surface. Prime example of LEDs having a p-type and an n-type electrode on the same side is blue light GaN LEDs. Portions of yellow, red and green LEDs having a p and n-type electrode on one side are still applicable for the present embodiment. The second preferred embodiment is designed for a LED package structure is composed of an electro-static protective diode and a LED having a p and n-type electrode positioned on different sides. The example of LEDs having a p-type and an n-type electrode positioned on different sides are yellow, red and green LEDs. Some of blue LEDs having a p-type and an n-type electrode on different sides are still viable for the second embodiment.

Figure 1:
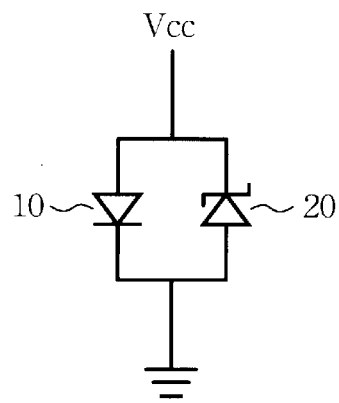
FIG. 1 is a schematic diagram of a LED circuit with an electrostatic protective function formed by parallel connection of a forward-biased LED and a reverse-biased Zener diode.
Figure 2:
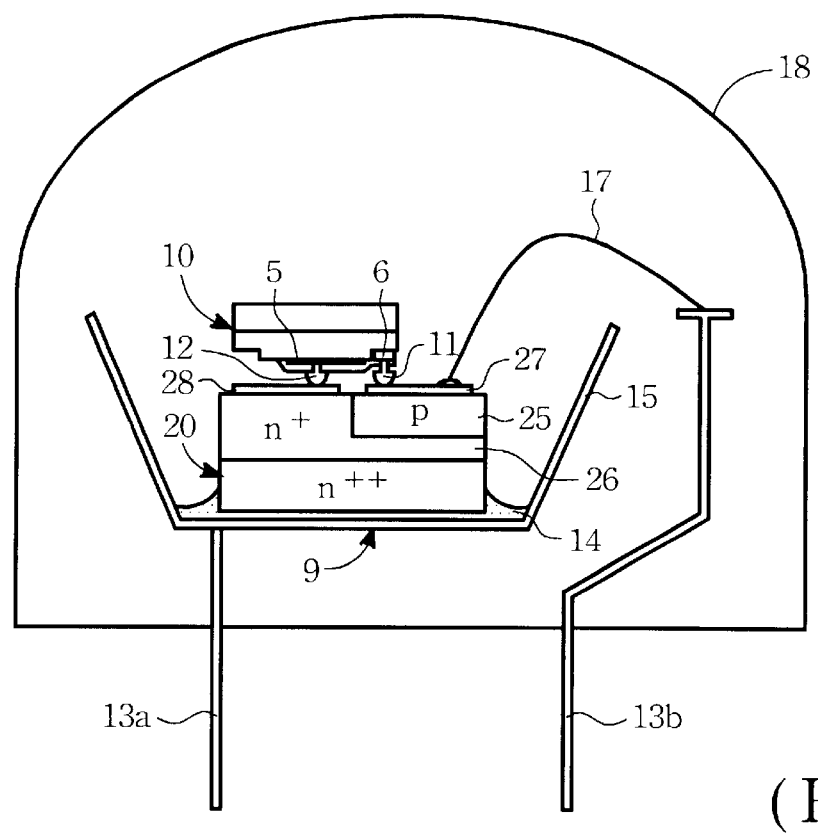
FIG. 2 is a schematic diagram of the first embodiment according to the prior art; a LED positioned in a flip-chip configuration aligns with a Zener diode to form a LED structure with an electrostatic protective function.
Figure 3:
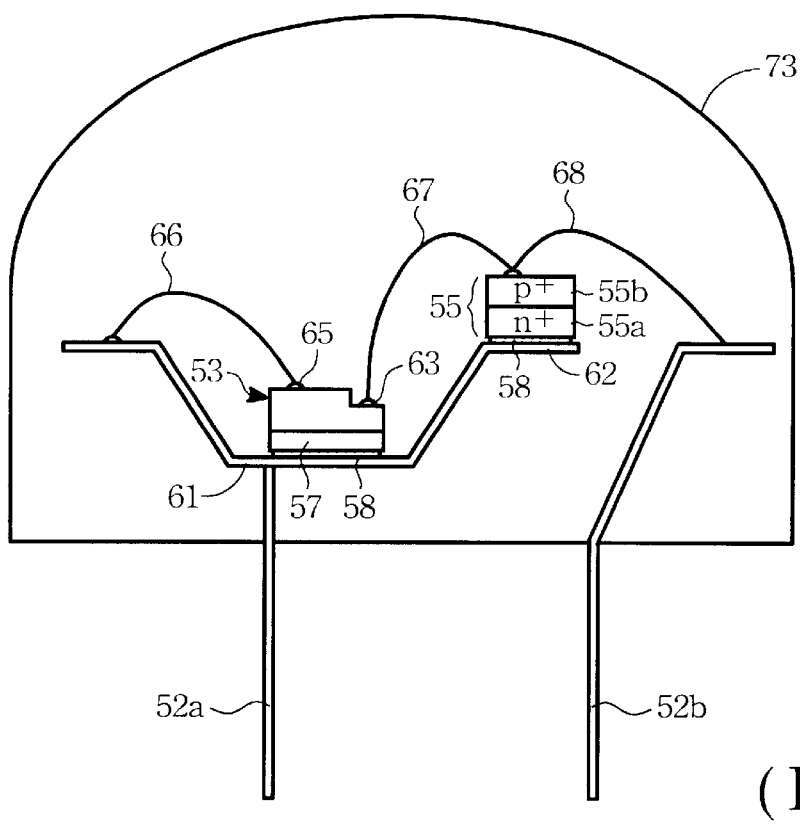
FIG. 3 is a schematic diagram of the second embodiment according to the prior art, a LED and a Zener diode mounted on different position of a lampstand so as to form a LED structure with an electrostatic protective function.
Figure 4:
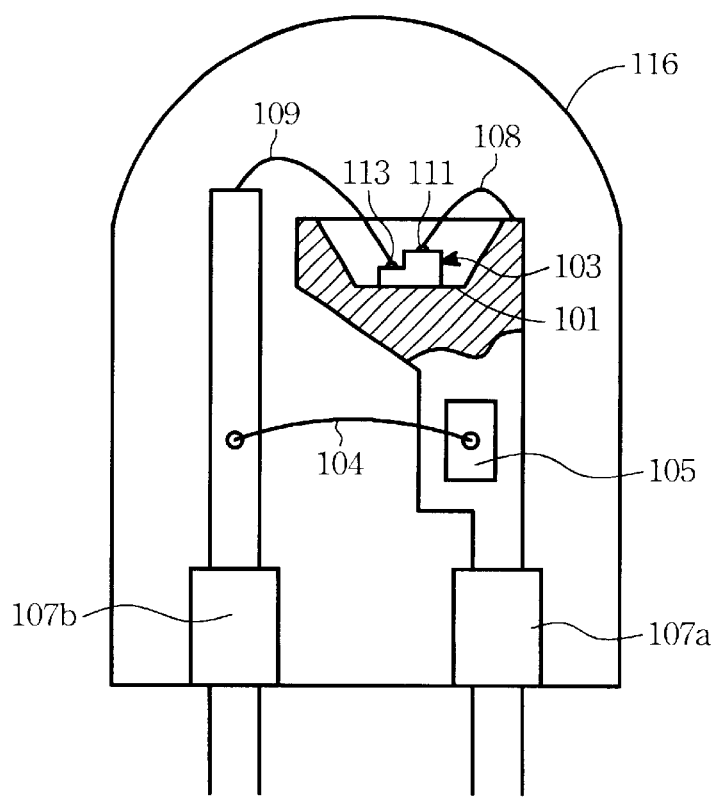
FIG. 4 is a schematic diagram of the third embodiment according to the prior art, a LED mounted on a bottom face of a lampstand and a Zener diode mounted on the side of a positive electrode of the leadframe so as to form a LED structure with an electrostatic protective function.
Figure 5:
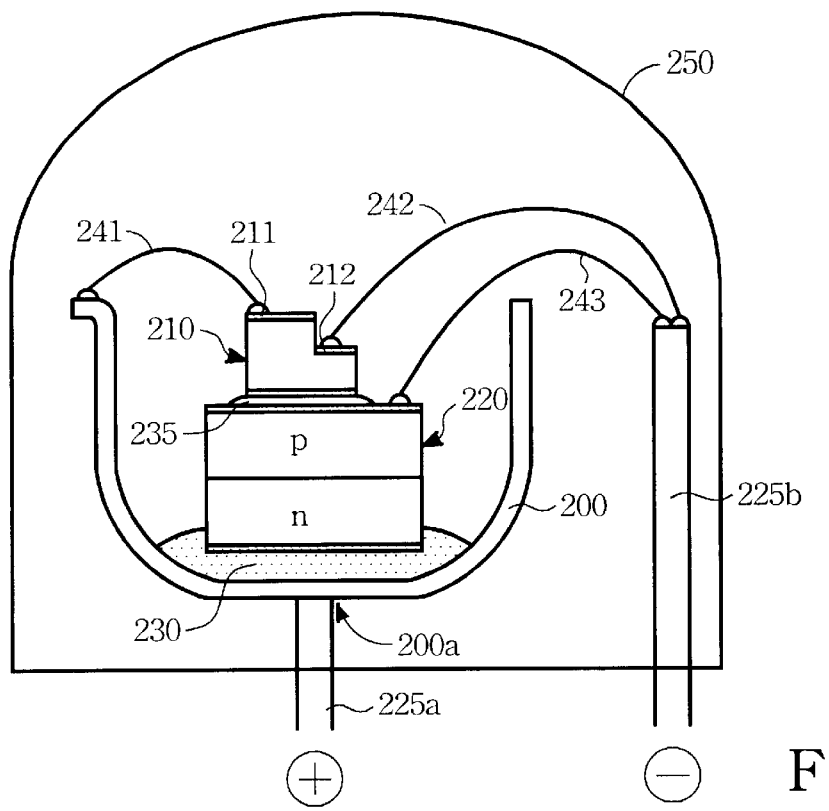
FIG. 5 is a schematic diagram of the first preferred embodiment according to the present invention: a Zener diode mounted on the bottom face of a lampstand connects a positive electrode of the leadframe, and a LED, having a p-type and an n-type electrode thereof on different sides, is mounted on a p-type electrode of the Zener diode.

Please refer to FIG. 5 of a schematic diagram of the first preferred embodiment according to the present invention. The package structure consisting of a lampstand 200, an electro-static protective diode 220 and a LED 210. The lampstand, is composed of metal material, forms a downward cone-shaped reflector for light reflection and with a plane surface 200a on its bottom. The typical electro-static protective diode is a Zener diode 220. In the present preferred embodiment, the Zener diode 220 is as a conventional one having a p-type and an n-type electrode on different sides, as shown in the figure.

In accordance with the first preferred embodiment, the Zener diode 220 having an n-type electrode formed at its bottom is mounted on the bottom 200a of the lampstand 200 with conductive pastes 230 such as silver pastes. The bottom 200a of the lampstand 200 is supported by a leadframe 225a, which is a positive electrode connecting with the positive terminal of D.C. power source. A negative electrode of the leadframe 225b beside the lampstand 200 connects to a negative terminal of D.C. power source. The p-type electrode of Zener diode 220 is upward and the LED 210 is located thereon. The interface between them is a white insulating paste 235 such as white paste or white wax or other thermal solidify resin for isolating the Zener diode 220 and the LED 210 and to increase the light reflection as the light is toward the bottom face. A p-type electrode 211 of the LED 210 connects the lampstand 200 via a first conductive wire 241, and an n-type electrode 212 of the LED 210 connects the negative electrode of the leadframe 225b via a second conductive wire 242. Furthermore, a third conductive wire 243 connects the p-type electrode of the Zener diode 220 with the negative electrode of the leadframe 225b. Subsequently, a resin 250 is used to encapsulate resultant structure composed the LED 210, the Zener diode 220, and the all the bonding wire 241, 242, and 243, including a portions of the leadframe 225a and 225b. Resins 250 are usually injected to a dome-shaped mold to complete the LED package. In order to reduce the loss of light due to the light collection and transformation, the resin 250 contains none impurity and should be form a smooth surface without any protruding or recessed point.

Figure 6:
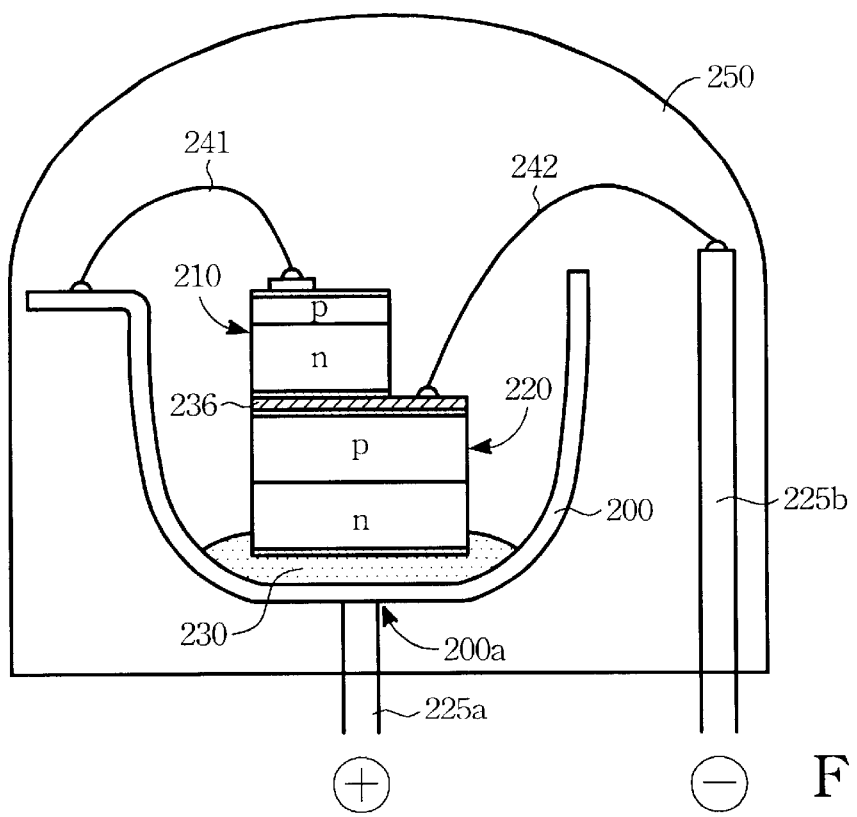
FIG. 6 is a schematic diagram of the second preferred embodiment according to the present invention: a Zener diode mounted on the bottom of a lampstand connects a positive electrode of the leadframe, and a LED having a p-type and an n-type electrode thereof on one side is mounted on a p-type electrode of the Zener diode.

Please refer to FIG. 6 of a schematic diagram of the second preferred embodiment. As the first preferred embodiment of the present invention, the Zener diode 220, having an n-type electrode formed at its bottom face, is mounted on the bottom 200a of the lampstand 200 with conductive pastes 230. The bottom 200a of the lampstand 200 is supported by the leadframe 225a: a positive electrode. The positive electrode of the leadframe 225a and the negative electrode of the leadframe 225b respectively connect to the positive and the negative electrode of D.C. power source. A top surface of the Zener diode 220 with conductive paste 236 connects to the n-type electrode of the LED 210,which has a p-type and an n-type electrode on different sides.

In the present structure, since the n-type electrode of the LED 210 directly contacts the p-type electrode at top surface of the Zener diode 220, there is one conductive wire of the present structure less than that of the first preferred embodiment according to the present invention. Only two conductive wires are needed in present embodiment including a first conductive wire 241 connecting the p-type electrode of the LED 210 with the positive electrode of the leadframe 225a and a second conductive wire 242 connecting the p-type electrode of the Zener diode 220 with the negative electrode of the leadframe 225b.

The advantages of the present invention:

1. It is suitable for LEDs having a p-type and an n-type electrode positioned on one side or on different sides without altering current package machines design.
2. The process steps can be reduced with LEDs having a p-type and an n-type electrode on different sides.
3. Since the wire-bonding position is upward instead of in flip-chip configuration, and without short circuit risk due to the is no problem of silver paste overflow caused by thin-thickness LEDs, the present invention can provide high process yield and simple operation.

Although the preferred embodiments have been described in some detail, the present invention is not limited therein; other modifications and alternations without departing from the spirit a scope of the present invention should be construed by the appended claim.

What is claimed is:

1. A light emitting diode (LED) apparatus having an electro-static protective diode, said apparatus comprising:
    a lampstand;
    an electro-static protective diode having an n-type electrode formed thereon with conductive pastes mounted on a bottom of said lampstand therefrom connected to a positive leadframe of said lampstand;
    a LED having a p-type electrode and an n-type electrode positioned on the same side, and a bottom of said LED mounted with an insulating layer atop a p-type electrode of said electro-static protective diode;
    a first conductive wire, connecting between said p-type electrodes of said LED and said positive leadframe of said lampstand;
    a second conductive wire, connecting between said n-type electrode of said LED and a negative leadframe of said leadframe; and
    a third conductive wire, connecting between said p-type electrode of said electro-static protection diode and said negative leadframe of said leadframe.

2. The apparatus of claim 1 wherein said LED has a bottom area small than said that of said electro-static protective diode.

3. The apparatus of claim 1 wherein said insulating layer is a thermal solidify material.

4. The apparatus of claim 1 wherein said insulating layer is a white paste or a white wax.

5. The apparatus of claim 1 wherein said electro-static protective diode is a Zener diode.

6. The apparatus of claim 1 wherein said LED is a red or a yellow LED.

7. The apparatus of claim 1 wherein said LED is a blue or a bluish LED.

* * * * *